United States Patent [19]

Sopori

[11] Patent Number: 5,577,157
[45] Date of Patent: *Nov. 19, 1996

[54] OPTICAL PROCESSING FURNACE WITH QUARTZ MUFFLE AND DIFFUSER PLATE

[75] Inventor: Bhushan L. Sopori, Denver, Colo.

[73] Assignee: Midwest Research Institute, Kansas City, Mo.

[ * ] Notice: The term of this patent shall not extend beyond the expiration date of Pat. No. 5,452,396.

[21] Appl. No.: 462,752

[22] Filed: Jun. 5, 1995

Related U.S. Application Data

[63] Continuation of Ser. No. 192,383, Feb. 7, 1994, Pat. No. 5,452,396.

[51] Int. Cl.$^6$ .......................... H05B 1/02; H01L 21/205
[52] U.S. Cl. ........................ 392/416; 219/390; 219/411; 392/408; 250/504 R; 118/724; 427/557; 359/599; 437/247
[58] Field of Search .................. 392/416, 418, 392/408, 420, 411; 219/390, 405, 411, 385, 521; 250/495.1, 504 R; 118/724, 725, 50.1; 437/248, 247; 427/542, 557, 585; 373/112; 362/32, 311, 355; 216/24, 60, 66; 359/599; 313/116; 374/131

[56] References Cited

U.S. PATENT DOCUMENTS

| | | | |
|---|---|---|---|
| 1,556,796 | 10/1925 | Minter | 216/66 |
| 1,778,305 | 10/1930 | Blau | 362/355 |
| 2,132,390 | 10/1938 | Blau | 359/599 |
| 4,039,775 | 8/1977 | Andra | 219/385 |
| 4,101,759 | 7/1978 | Anthony et al. | 392/411 |
| 4,382,776 | 5/1983 | Kawase et al. | 432/253 |
| 4,469,529 | 9/1984 | Mimura | 437/19 |
| 4,489,234 | 12/1984 | Harnden, Jr. et al. | 392/408 |
| 4,540,876 | 9/1985 | McGinty | 219/405 |
| 4,550,245 | 10/1985 | Arai et al. | 219/405 |
| 4,576,486 | 3/1986 | Dils | 374/131 |
| 4,680,447 | 7/1987 | Mahawili | 392/408 |
| 4,755,654 | 7/1988 | Crowley et al. | 219/405 |
| 4,761,538 | 8/1988 | Chiba et al. | 219/497 |
| 4,799,787 | 1/1989 | Mason | 374/131 |
| 4,820,906 | 4/1989 | Stultz | 219/405 |
| 4,857,704 | 8/1989 | Jannot et al. | 392/416 |
| 4,924,073 | 5/1990 | Chiba | 219/413 |
| 4,956,538 | 9/1990 | Moslehi | 219/121.6 |
| 5,092,680 | 3/1992 | Kobayashi et al. | 374/131 |
| 5,179,677 | 1/1993 | Anderson et al. | 392/411 |
| 5,452,396 | 9/1995 | Sopori | 392/416 |

FOREIGN PATENT DOCUMENTS

| | | |
|---|---|---|
| 55-110832 | 8/1980 | Japan . |
| 60-161616 | 8/1985 | Japan . |
| 60-236216 | 11/1985 | Japan . |
| 1-164793 | 6/1989 | Japan . |
| 1-309286 | 12/1989 | Japan . |
| 3-131027 | 6/1991 | Japan . |
| 4-285105 | 10/1992 | Japan . |

Primary Examiner—John A. Jeffery
Attorney, Agent, or Firm—Edna M. O'Connor

[57] ABSTRACT

An optical furnace for annealing a process wafer comprising a source of optical energy, a quartz muffle having a door to hold the wafer for processing, and a quartz diffuser plate to diffuse the light impinging on the quartz muffle; a feedback system with a light sensor located in the wall of the muffle is also provided for controlling the source of optical energy.

11 Claims, 3 Drawing Sheets

OPTICAL PROCESSING FURNACE WITH QUARTZ MUFFLE AND DIFFUSER PLATE

The United States Government has rights in this invention under Contract No. DE-AC02-83CH10093 between the United States Department of Energy and the National Renewable Energy Laboratory, a division of the Midwest Research Institute.

This is a Continuation of application Ser. No. 08/192,383 filed Feb. 7, 1994, now U.S. Pat. No. 5,452,396.

BACKGROUND OF THE INVENTION

The instant invention relates to an optical processor or furnace for delivering optical energy of certain predetermined characteristics to a process-wafer or semiconductor wafer. Specifically, the optical furnace uses a bank of lights for annealing the process wafer as used in semiconductor device fabrication. In the past, the distribution of light in a conventional processor displays non-uniformities reminiscent of the spatial distribution of the lamps. The instant invention uses a diffuser in combination with a quartz box to direct the light to process the wafer. The invention also uses a sensor or detector for measuring the light to monitor optical energy delivered and transmitted into the process wafer, thus the optical energy delivered in watts/cm$^2$ is used to control the process. The detected optical energy is also used to determine the steady-state temperature of the wafer during processing.

The improved optical processor is used during the fabrication of semiconductor devices, and as such is important for the microelectronic and photovoltaic industries. In the semiconductor industry electronic components and circuitry are formed in a thin wafer of semi-conductive material. During processing, the wafer at various stages is subjected to heat treatment or annealing.

Electric ovens or furnaces have been used for heat treatment. However, such ovens are expensive and slow to use and typically result in distortion of the wafer due to impurity redistribution. Such distortion occurs through impurity diffusion into the wafer since impurities permeate through the hot walls of the furnace or oven.

Conventional rapid thermal annealers are now used extensively in the industry. Such annealers use an optical source powerful enough to quickly raise the temperature of the semiconductor device. However, such annealers, by raising the speed of heating, also increase non-uniform heating of the process wafer. Also, the lamp separation as well as the output distribution from the lamp contributes to such non-uniform heating of the process wafer.

Such prior art processes for fabricating semiconductors have introduced several problems that up to now have been lacking in solutions. Conventional rapid thermal annealers typically introduce non-uniform light which creates undesirable light patterns in the processwafer, and causes breakage of and/or fissures in, any glass used in the furnace. If the process-wafer is not heated uniformly, such temperature variations have a residual, uncontrollable effect on the resulting electrical characteristics of the processed wafer. These undesirable electrical characteristics are the result of non-uniform electrical activation, and/or the result of defects and distortions in the wafer caused by the stress associated with the uneven light processing.

Also included in prior art processes is a feedback system for measuring the temperature in the particular furnace used. Such a feedback system typically uses the measured temperature to adjust the amount of power delivered by the electrical heat sources. Generally such heat measurements are taken off the wafer itself by a thermocouple which presents time delays in correcting the electrical sources. Other means of temperature measurement, such as pyrometers, have also been used.

In the past semiconductor wafers have been heat processed in a quartz sleeve or envelope or under a quartz cover. Such a feature is shown in U.S. Pat. No. 4,540,876 to McGinty, U.S. Pat. No. 4,794,217 to Quan et al, and U.S. Pat. No. 5,179,677 to Anderson et al. The use of a silica box is also shown in U.S. Pat. No. 4,550,245 to Arai et al. Such boxes or envelopes were used to even the light dispersement, and to allow the introduction of cooling gases. They also shield the process-wafer from may cooling atmosphere. It was thought that the use of quartz or silica allowed the excess optical energy to pass therethrough. Such boxes or envelopes are formed of high temperature melting material as shown in the references.

Several problems not recognized or addressed by the references are the subject of the instant application, however. Notably the references do not discuss the possibility of excessive absorption of light by the quartz box or envelope. This absorption of such high intensity light over a period of time results in cracking and ultimately breakage of the quartz box or envelope. Replacement of such quartz boxes and envelopes is expensive, and interrupts the manufacturing process.

The absorption also results in heating of the quartz or silica box or envelope. This heating provides impurity migration to or in the process-wafer, and such impurities are detrimental to the final product. Energy absorption by the quartz box or envelope effects the total energy absorption of the semiconductive wafer.

The use of parallel quartz plates between the light sources and a process-wafer is shown in U.S. Pat. No., 4,680,447 to Mahawili, and U.S. Pat. No. 4,101,759 to Anthony et al. In both cases the use of parallel plates was directed to cooling concerns. In the 4,680,447 patent, temperature controlling fluid is passed between the two plates to prevent excessive heating. In the 4,101,759 patent the second plate is used to minimize free convection cooling of the semiconductor wafers. Thus the references are not concerned with damage of the quartz plate due to excessive heat absorption. Divitrification and cracking as a precourse to breaking of the quartz is not discussed by either of the references.

A diffuser to disperse the light is shown in U.S. Pat. No. 4,755,654 to Crowley et al. The use of a quartz envelope or box in combination with the diffuser is not shown. The reference uses a lens as a diffuser to redistribute the light from the lamp and the reflector on a wafer. The diffuser can also act like a diffraction grating to expose the semiconductor to a particular non-uniform light pattern. Unlike the instant invention the patent discloses the use of a box with a reflective surface for wafer support. The use of a quartz box or muffle is not contemplated by the patent.

One solution for the problem of uneven heating is shown in U.S. Pat. No. 4,469,529 to Mimura. This solution requires the use of supplemental circumferential heating. This is a more expensive and complicated solution than that of the instant invention.

A second feature of the instant invention is a novel feedback light sensing system. The feedback system of U.S. Pat. No. 4,857,704 senses radiation reflected off the back of the water. A prism and optical fiber is used to direct the radiation. This required structure adds to the expense of the feedback system, and requires the additional step of receiving reflected radiation from the probe.

A temperature sensing feedback system is shown in U.S. Pat. No. 4,761,538 to Chiba et al. To detect the temperature a sensor such as a thermocouple is provided in the heater furnace. Infrared detectors are used to measure laser beam power for determining real-time wafer temperature in U.S. Pat. No. 4,956,538 to Moslehi. Again an extensive optical system is required to perform the sensing.

An arc lamp for semiconductor heating is shown in U.S. Pat. No. 4,820,906 to Stultz. The patent also specifically discloses the use of quartz to surround the lamp electrodes.

SUMMARY OF THE INVENTION

It is an object of the instant invention to provide a real-time radiation sensing feedback system which requires minimum additional structure.

It is a further object of the invention to provide a radiation sensor which uses the trapped radiation from a quartz box or muffle to provide feedback as to radiation intensity transmitted into the process wafer. The radiation sensor can also be positioned to monitor the radiation in the quartz box or muffle.

It is an additional object of the instant invention to provide a diffuser to improve the uniformity of illuminating light in an optical furnace for semiconductor processing.

It is a further object of the invention to provide a diffuser in an optical furnace to protect the quartz muffle or box from excessive absorption of incident light, and thus to increase the life span of the quartz muffle or box.

It is an additional object of the invention to provide a method for making a diffuser in an optical furnace which can be used with a quartz muffle or box during semiconductor processing.

An optical furnace is provided for processing semiconductor wafers with visible and infrared radiation. The furnace comprises a bank of tungsten-halogen or other suitable lights, a reflector for dispersing the radiation from the bank of lights, a diffuser for dispersing the light in a uniform manner, a wafer carrier and transport mechanism, a quartz muffle for surrounding the wafer carrier, a wafer transport mechanism, an enclosure for the wafer carrier, transport and quartz muffle, a light sensor on the wall of the quartz muffle or box, or on the door for closing the muffle or box, and control means responsive to the light sensor to vary the radiation emitted from the lamps. Cooling features include the use of a cooling fluid with the lights and/or reflector, and use of a cooling gas in the quartz muffle or box.

The process of the instant invention includes the steps of providing an optical furnace, a bank of lights and a sheet of quartz; running the bank of lights at nearly maximum intensity to radiate the sheet of quartz wherein its surface is etched by the high intensity light to provide a diffuser; providing a quartz muffle and placing the diffuser between the top of the quartz muffle and the bank of lights; providing a wafer transport, a wafer carrier on the wafer transport, and a wafer on the wafer carrier; moving the wafer transport, wafer carrier, and wafer into the quartz muffle so that the wafer is positioned under the bank of lights and the diffuser is positioned over the wafer and the top of the quartz muffle; radiating the wafer through the diffuser and the top of the quartz muffle, sensing the light radiation received through or in the quartz muffle, and adjusting the intensity of the radiation of the bank of lights in response to the sensed radiation. The above process will provide substantially even radiation of the wafer to be processed.

DESCRIPTION OF THE PREFERRED EMBODIMENT

Figure 1:
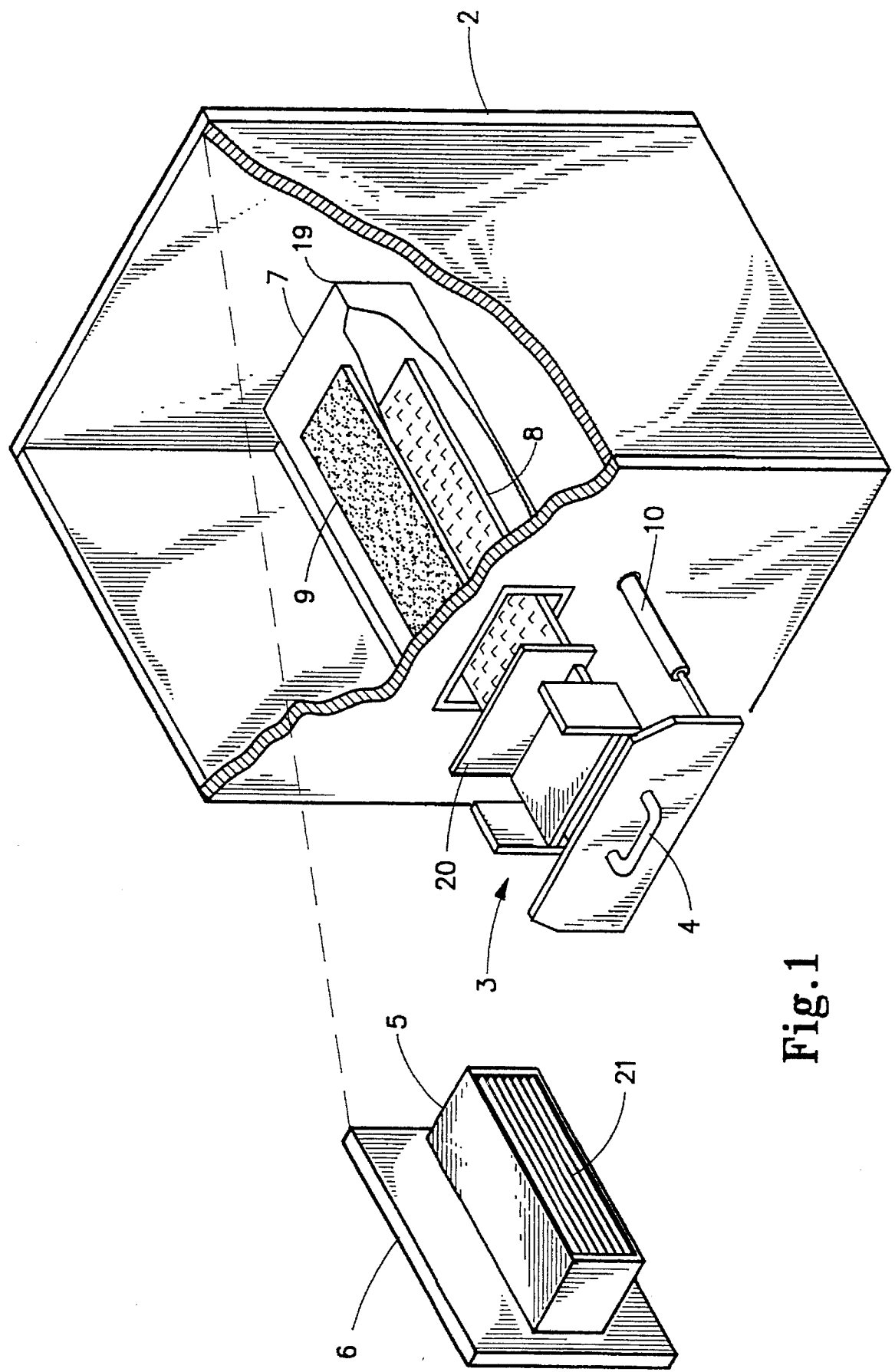
FIG. 1 is an exploded, partially cut away view of the optical furnace of the instant invention.

The optical furnace of the instant invention which is used to anneal semiconductor wafers is shown generally in FIG. 1. The furnace includes a box-like enclosure 2 which is formed of anodized aluminum or other suitable material. The internal surfaces of the box are of low-emissivity material to minimize the energy loss through the walls. The enclosure houses the components necessary to anneal the semiconductor or process wafer.

Mounted in a side wall of the enclosure is a wafer transport mechanism 3. Such a mechanism is well known in the art and will not be described in detail. Generally, the transport mechanism is used to move wafer carrier 8 into and out of the box-like furnace enclosure. The transport carriers are shown at 10. A handle 4 is provided for operator control. The wafer material 30 to be processed is supported on wafer carrier 8.

Also included in the optical furnace is a bank of lights 21 providing optical energy which will be described in greater detail later. The lights are located in housing 5 which is attached to the top, 6, of the furnace enclosure, although other constructions for supporting the lights above the wafer material were contemplated.

The interior of the furnace enclosure further includes quartz box or muffle 7 with door 20 and diffuser 9, both of which will be described in greater detail latter.

Figure 2:
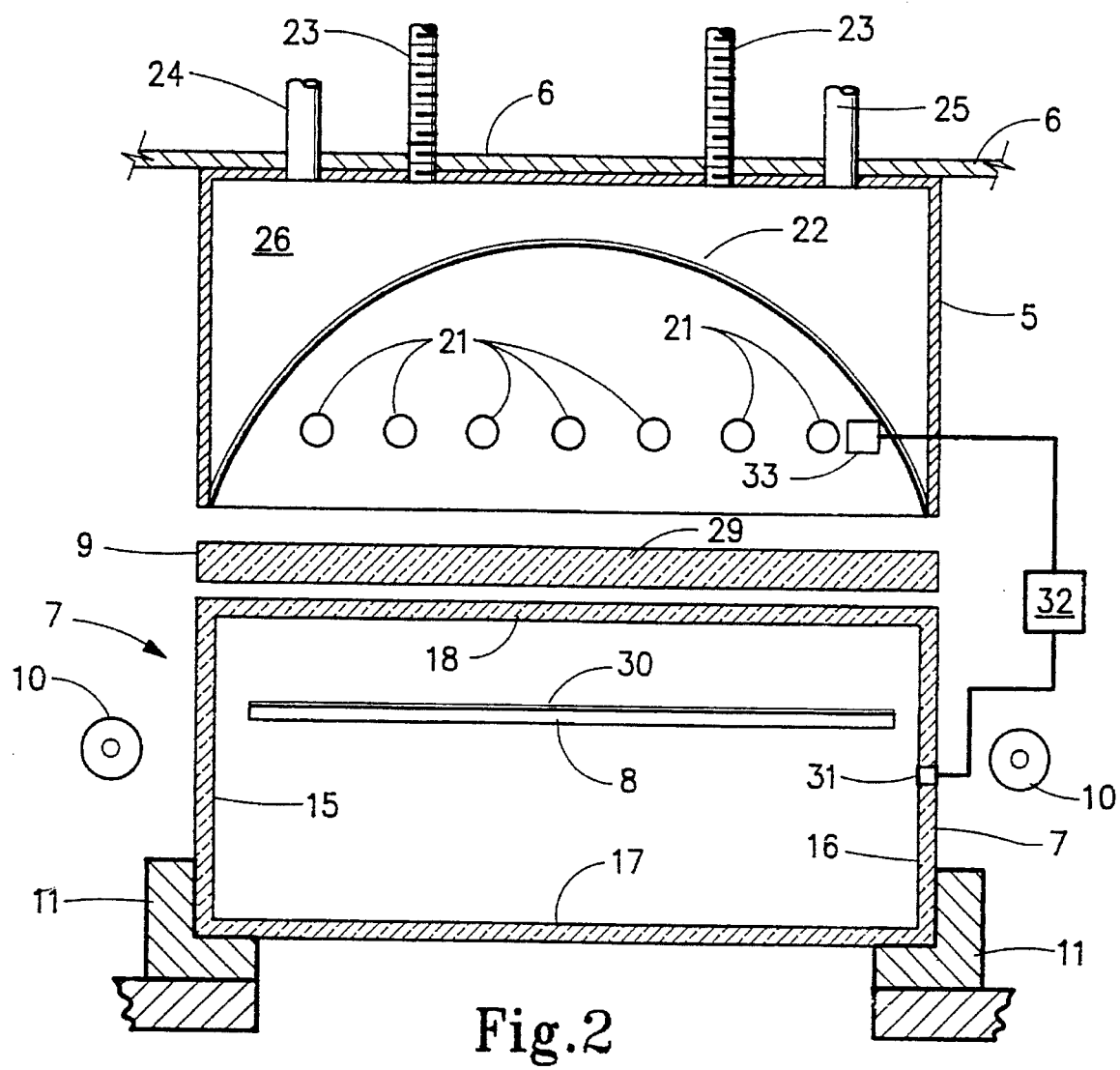
FIG. 2 is an enlarged cross-sectional view of the interior of the optical furnace schematically showing the radiation sensor or detector mounted in the wall of the quartz muffle.

The optical source will now be more particularly described with respect to FIG. 2. The furnace includes a bank of lights 21. Seven are shown, although the number can be varied depending on size constraints. In the preferred embodiment the lights are preferably tungsten-halogen lamps although other suitable forms of light, such as xenon arc or krypton lamps, can be used. The tungsten-halogen lamps give a display of light or optical energy which has non-uniformities reminiscent of the spatial distribution of the lamps. These nonuniformities produce variations in the device process which, in turn, reduce the process yield.

A reflector 22, well known in the art, helps direct the light. Due to the high intensity of the lights, it is necessary to provide a cooling system. Various well known methods have been used. The configuration of FIG. 2 provides an inlet 25 to introduce the cooling fluid or water into chamber 26. This helps maintain reflector 22 and the lights 21 at the proper temperature. The circulating water or cooling fluid exits the chamber 26 through outlet 24.

Other well known cooling techniques can also be used, such as providing conduits in the reflector for the cooling fluid or water.

A well known height adjustment for the lamp assembly is shown at 23. The height adjustment is used to vary the distance between diffuser 9 and the bank of lights 21. Adjustments can also be provided for moving the bank of lights into better position with respect to the wafer material.

The quartz muffle or box will be described with particular reference to the figures. The quartz muffle 7 includes a top 18, bottom 17, sides 15 and 16, and an end 19, (FIG. 1). The quartz muffle or box is supported on block-type supports 11 in the furnace enclosure 2. It is preferable that interior supports be minimized to prevent thermal mass and excessive heat absorption. The other end of the quartz muffle, (not shown), is provided with an opening and a door 20 formed of quartz for insertion of the wafer carrier 8 and wafer material 30. The exterior transport structure including the handle 4 are attached to the door 20 in any well known manner.

The quartz muffle or box is able to transmit light, and such optical energy is transmitted through the quartz muffle into a lower cavity of the furnace enclosure 2. This transmission of radiation prevents heat build-up in the muffle box, and allows the lower surface of the process-wafer to radiate effectively. To further cool the muffle or box a gas such as argon is used inside the muffle. The muffle cavity is filled with the flowing argon for cooling purposes and to prevent dust accumulation on the muffle. A conventional gas metering system is used to control the flow of argon and other processing gases through the muffle.

Heat buildup can be further reduced by active cooling of the furnace enclosure walls by use of a cooling gas in a well known manner. Nitrogen can be used inside the enclosure 2 exterior of the muffle for cooling purposes.

Another method of effectively cooling would be to pass water or a cooling liquid under the bottom of the outer enclosure to remove excess heat.

Although quartz muffles or boxes provide an enclosure with transmissive surfaces, they are expensive to make and replace. Due to the high intensities of optical energy involved, replacement of the muffle or boxes is frequently required. When the muffle absorbs excessive amounts of the high intensity light, damage of the muffle surfaces occurs which produces associated breakage to the box. Specifically, the surface exposed to the excessive radiation will become damaged with cracks and fissures. Over a period of time such cracks and fissures bring about breakage of the muffle.

The instant invention includes the addition of a diffuser plate 9 to extend the life of the muffle or box. The diffuser plate 9 is composed of quartz or other transmissive material. The top surface of the diffuser is intentionally roughed to disperse or diffuse the light. The diffuser is placed on the top of the quartz muffle or slightly spaced therefrom, (depending on any diffuser support structure). The diffuser covers the top 18 of the muffle to diffuse the light entering therein.

This diffusion of light intensity performs two important functions. Namely it disperses light over the top surface of the quartz muffle to minimize excessive heat absorption by a particular surface area of the muffle which decreases divitrification of such surface area, extending the muffle life. The diffuser also evens the distribution of the light incident on the wafer material to provide for an even and controlled exposure. This greatly improves uniformity of the illuminating light and thus increases the process yield.

The diffuser can be fabricated on sight in the optical furnace. The optical furnace system for processing semiconductor wafers typically includes a burn-in process where the system is run at a high (nearly maximum) rated power of the light sources for a known period of time. As the diffuser is formed of quartz, the extreme high intensity of the burn-in light will cause thermal etching of the top surface of the diffuser. This will create the optical properties necessary for the diffusion of the incident light. Thus the diffuser can be manufactured in its operating location. To manufacture the diffuser, the system is ran at a power density in the range of 10 –20 watts/cm$^2$ intermittently for a few hours. This also completes the annealing process of the quartz muffle and any other quartz components.

It should also be appreciated that the diffuser is cheaper to manufacture than the quartz muffle or box. Since it can also be manufactured as part of the annealing process, the replacement of such a diffuser will not substantially effect the normal operation of the system. Thus, should the diffuser crack substantially and break, replacement can be done with minimum effort and lost time.

It is critical that the wafer material have accurate and even light exposure to provide an accurate end product. To this end the light transmissive features of the quartz muffle or box can be used. Specifically, a feedback mechanism is provided which receives an optical signal from the light within the muffle walls, and uses such signal to control the optical energy being delivered by the light source.

The feedback system includes a photodiode or light sensor for detecting the light radiation or optical energy. In the embodiment of FIG. 2, the radiation is detected in the wall 16 of the quartz muffle. The light sensor 31 for detecting such radiation is embedded in the quartz itself. The light trapped in the wall 16 of the muffle, which is detected by the photodiode 31, is a monitor of the optical energy incident on the process wafer. The output of the detector or sensor 31 is fed to a well known control unit 32 which in turn is used to vary the light power control 33. Thus the output of the bank of lights 21 can be directly detected and directly varied using the feedback system. Any well known photodiode can be used for the detection although a silicon type is preferred.

This system produces real time light detection and feedback which does not produce a lag time in the input and output of the light source. The feedback system of the instant invention controls the actual light output delivered to the process-wafer. It is appreciated that the detector or sensor can also be oriented to detect light in the interior of the muffle itself, rather than in the wall, thereby providing feedback for light control.

Figure 3:
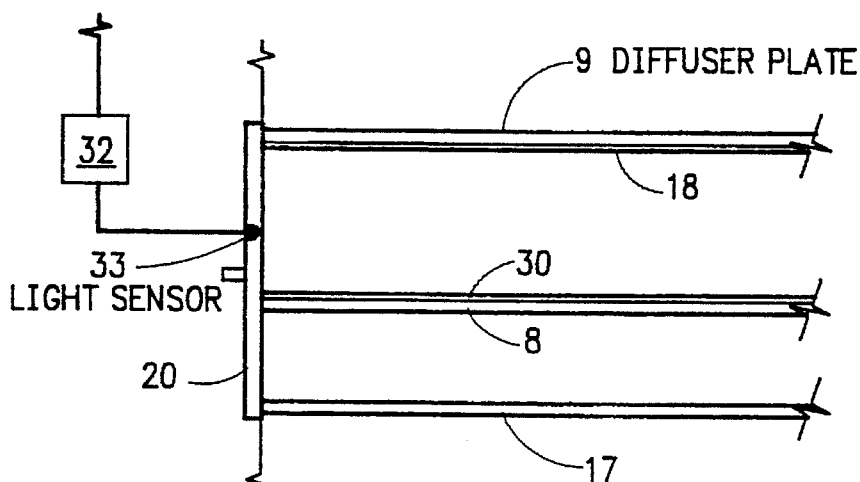
FIG. 3 is a side cross-sectional detail view of an alternative embodiment of the instant invention schematically showing the radiation sensor or detector mounted in the door.

FIG. 3 illustrates an alternative location for the radiation detector or sensor 33. The external handle structure is cut away in this illustration. In this embodiment the radiation detector 33 is embedded in the quartz door 20 of the housing 22. The detector 33 is used to monitor the radiation within the muffle itself and is oriented to receive the radiation therefrom. It is understood that the door 20 can be located so that the detector receives optical energy transmitted through the quartz wall. The output of this detector 33 is provided to the well known control unit 32, which is used to vary the power of the bank of lights.

Figure 4:
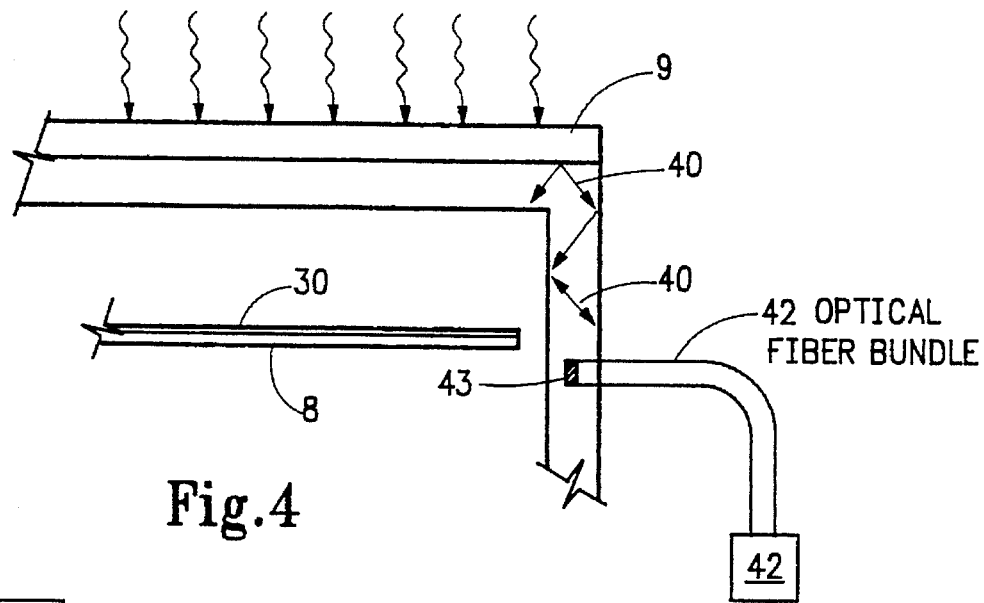
FIG. 4 is an enlarged detail cross-sectional view of an alternative embodiment showing fiber optics and a remote radiation detector or sensor.

FIG. 4 shows an embodiment similar to that of FIG. 2, but includes fiber optics and a remote detector 42. The fiber optics is particularly useful when temperatures inside the muffle are too high for an accurate reading with an embedded detector. The fiber optics is shown at 41 and consists of a well known bundle of optical fibers. The ends 43 of the bundle 41 are embedded in the quartz wall 16 of the muffle 7. The fiber optics 41 receives light radiation 40 that is trapped and dispersed through the muffle wall or it can be oriented to receive radiation from the interior of the muffle. The fiber bundles 41 direct the light radiation to remote detector 42. The output of the detector is again fed to a well known control unit (not shown) which is used to vary a light power controller (not shown).

Figure 5:
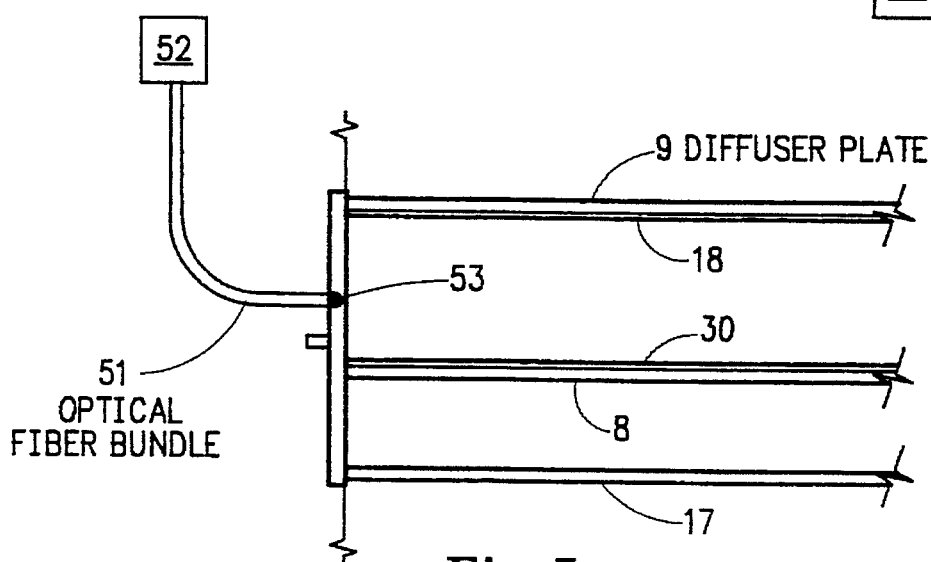
FIG. 5 is a cross-sectional detail view of an alternative embodiment, similar to FIG. 3, showing fiber optics and a remote radiation detector.

FIG. 5 illustrates a further embodiment which is similar to FIG. 3, but uses fiber optics 51 and a remote detector 52. Specifically, the door mounted detector 33 of FIG. 3 is replaced with fiber optics 51 and a remote detector 52. The ends 53 of the fiber optics are located in the door 20 to receive radiation from inside the muffle. The output of the remote detector 52 is provided to a well known control unit (not shown) which is used to vary the light radiation. This embodiment is again useful due to the high temperatures inside the muffle, such high temperatures being produced by the optical energy from the bank of lamps. The remote detector 52 assures accurate radiation detection. Again, the door and detector can be located to receive the light radiation that is trapped within the muffle wall.

It is understood that other modifications can be made to the furnace of the instant invention. They include, but are not limited to, the use of filters between the light source and the diffuser. Also the spectrum of the bank of lights can be varied by controlling the operating voltage applied to the lamps.

Also, the features of the instant invention can also be used with commercially available conventional rapid thermal annealers.

Although the present invention has been described in detail it is understood that such is illustrative and for example purposes, and not to be taken as limiting; the spirit and scope of the present invention being limited only by the terms of the appended claims.

I claim:

1. An optical furnace for annealing process wafer material comprising:

a transmissive muffle comprising a top, bottom, and a plurality of walls defining sides, a source of optical energy, said source positioned relative to said muffle to direct light energy through the top of said muffle, a water carrier located in said muffle for supporting the process wafer material to be annealed, and a diffuser located between said source of optical energy and the top of said muffle to diffuse optical energy from said source of optical energy before said light energy enters the top of said muffle to disperse the optical energy through the walls of the muffle, and means for sensing optical energy received by the muffle wherein said sensing means is located in one of said walls for sensing optical energy dispensed through said one wall.

2. The optical furnace of claim 1 wherein said source of optical energy comprises a plurality of light sources arranged in an array.

3. The optical furnace of claim 2 further comprising reflector means to direct the optical energy from said plurality of light sources.

4. The optical furnace of claim 2 wherein said plurality of light sources comprise a plurality of tungsten-halogen lights.

5. The optical furnace of claim 1 wherein one of said walls comprises an openable door and said sensing means is located in said openable door.

6. The optical furnace of claim 5 wherein said sensing means comprises an optical fiber bundle located in said door which receives optical energy from said muffle, and a remote detector in one end of the optical fiber bundle to receive energy from the muffle via the fiber optic bundle.

7. The optical furnace of claim 1 wherein said diffuser is formed of a quartz plate etched to disperse any light impinging thereon.

8. The optical furnace of claim 1 wherein said source of optical energy, diffuser, and transmissive muffle are contained in an enclosure having low-emissive walls to prevent against heat loss from the enclosure.

9. The optical furnace of claim 1 further comprising control means responsive to light sensed by said sensing means for varying the power of the source of optical energy.

10. The optical furnace of claim 1 wherein said transmissive muffle is formed of quartz.

11. The optical furnace of claim 1 wherein said transmissive muffle is formed of quartz, and said sensing means is embedded in the quartz.

* * * * *